(12) United States Patent
Lin et al.

(10) Patent No.: US 8,837,060 B2
(45) Date of Patent: Sep. 16, 2014

(54) IMAGE CAPTURE LENS MODULE AND WAFER LEVEL PACKAGED IMAGE CAPTURE DEVICES

(75) Inventors: Chun-Chi Lin, Hsinchu (TW); Jau-Jan Deng, Hsinchu (TW); Wei-Ping Chen, Taipei County (TW)

(73) Assignees: Visera Technologies Company Limited, Hsinchu (TW); Omnivision Technologies, Inc., Santa Clara, CA (US)

( * ) Notice: Subject to any disclaimer, the term of this patent is extended or adjusted under 35 U.S.C. 154(b) by 482 days.

(21) Appl. No.: 13/035,391

(22) Filed: Feb. 25, 2011

(65) Prior Publication Data

US 2012/0218648 A1 Aug. 30, 2012

(51) Int. Cl.
| | |
|---|---|
| G02B 9/04 | (2006.01) |
| G02B 9/08 | (2006.01) |
| G02B 13/00 | (2006.01) |
| G02B 5/00 | (2006.01) |
| H01L 27/146 | (2006.01) |
| G02B 9/02 | (2006.01) |

(52) U.S. Cl.
CPC ......... *G02B 13/003* (2013.01); *H01L 27/14618* (2013.01); *G02B 13/0085* (2013.01); *G02B 13/004* (2013.01); *G02B 9/02* (2013.01); *G02B 5/005* (2013.01); *G02B 9/04* (2013.01); *G02B 9/08* (2013.01)
USPC ........... 359/740; 359/793; 359/771; 359/717; 359/718; 359/715; 359/796

(58) Field of Classification Search
USPC .......................... 359/796, 717, 718, 739–740
See application file for complete search history.

(56) References Cited

U.S. PATENT DOCUMENTS

| | | | | |
|---|---|---|---|---|
| 4,268,134 A | * | 5/1981 | Gulati et al. | 351/159.62 |
| 4,834,517 A | * | 5/1989 | Cook | 359/366 |
| 7,876,511 B2 | * | 1/2011 | Oh et al. | 359/797 |
| 7,964,936 B2 | | 6/2011 | Shiung et al. | |
| 2002/0027715 A1 | | 3/2002 | Shimizu et al. | |
| 2006/0215269 A1 | | 9/2006 | Abe et al. | |
| 2009/0040626 A1 | * | 2/2009 | Oh et al. | 359/716 |
| 2010/0208354 A1 | | 8/2010 | Okazaki et al. | |
| 2011/0032409 A1 | * | 2/2011 | Rossi et al. | 359/738 |
| 2012/0287395 A1 | * | 11/2012 | Tamura et al. | 351/49 |

FOREIGN PATENT DOCUMENTS

| | | |
|---|---|---|
| CN | 1752786 | 3/2006 |
| CN | 201017093 | 2/2008 |

(Continued)

OTHER PUBLICATIONS

Klein, Miles V., and Thomas E. Furtak. Optics. New York: Wiley, 1986. 258. Print.*

(Continued)

*Primary Examiner* — Zachary Wilkes
(74) *Attorney, Agent, or Firm* — Muncy, Geissler, Olds & Lowe, P.C.

(57) ABSTRACT

Image capture lens modules and wafer level packaged image capture devices are presented. The image capture lens module includes a compound lens with a first lens element and a second lens element molded on both sides of a substrate, and a field stop disposed at an interface between the first lens element and the substrate or at an interface between the second lens element and the substrate, wherein the field stop is a coating layer with a polygonal transparent area.

20 Claims, 4 Drawing Sheets

(56) References Cited

FOREIGN PATENT DOCUMENTS

| | | |
|---|---|---|
| CN | 201199275 | 2/2009 |
| CN | 101442062 | 5/2009 |
| CN | 10162627 | 1/2010 |
| CN | 101827208 | 9/2010 |
| TW | 201003881 A | 1/2010 |

OTHER PUBLICATIONS http://en.wikipedia.org/wiki/135_film.*
http://en.wikipedia.org/wiki/135_film ; Downloaded 2013.*
Taiwan Office Action for Taiwan Application No. 100124877 dated Dec. 2, 2013.

* cited by examiner

IMAGE CAPTURE LENS MODULE AND WAFER LEVEL PACKAGED IMAGE CAPTURE DEVICES

BACKGROUND OF THE INVENTION

1. Field of the Invention

The invention relates to image capture lens modules, and more particularly to, high performance wafer-level packaged image capture lens modules and wafer level packaged image capture devices.

2. Description of the Related Art

Digital cameras utilizing high-resolution electronic imaging sensors typically require high resolution optical components such as image capture lens modules. The design and manufacturing of camera modules for portable electronic products is extremely challenging. Some pervasive factors include: high production volume, constant price erosion, size limitations and changing performance and functionality requirements.

The number of image capture lenses on a digital camera module that focus a scene onto an imager can be as few as one for a digital camera module, or as many as four for a digital camera module with mega pixel resolution. Usually, the lenses are plastic, to lower costs. However, higher quality digital cameras sometime use glass for the first lens because of its superior optical properties.

FIG. 1 is a schematic view illustrating a configuration of a conventional imaging lens. Referring to FIG. 1, a conventional imaging lens module 100 includes a first lens element 110, field stops 130, and a second lens element 120 received in a barrier body 140. The barrier body 140 and a flange 160 are formed together as a barrier. The flange 160 has a frustum hole 170 serves as an aperture stop. The first and second lens elements 110 and 120 include aspheric surfaces. The opaque area of field stops 130 is ring-like in shape. Spacers 150 are disposed at the rear end of the lens module. Conventional imaging capture lens modules adopt concentric plastic or metal ring field stops 130 stacked between the first and second lens elements 110 and 120. By using material characteristics of the plastic or metal field stop 130, scattered light and stray-light can be eliminated to improve image quality. A typical field stop 130 is formed with a concentric ring shape due to fabrication and lens module assembly compatibility.

There are, however, some problems for the conventional image capture lens module, such as inner light scattering, stray-light effect and ghost images. Ghost images are secondary images formed by stray-light reflected twice from lens, filter, window, and image sensor array surfaces. Particularly, the inner circular area of the plastic or metal field stop is larger than the effective sensing area of the image plane, resulting in multiple light reflections inside of the lens module. These multiple light reflections may result in ghost images and stray-light. Accordingly, wafer level packaged lens modules having no stray-light and reduced ghost images are desired for a digital camera.

BRIEF SUMMARY OF THE INVENTION

Embodiments of the invention provide an image capture lens module, comprising: a compound lens with a first lens element and a second lens element molded on both sides of a wafer level substrate; and a field stop disposed at an interface between the first lens element and the wafer level substrate or at an interface between the second lens element and the wafer level substrate, wherein the field stop is a coating layer with a polygonal transparent area corresponding to an effective sensing area.

Embodiments of the invention further provide an image capture lens module, comprising: a first compound lens with a first lens element and a second lens element molded on both sides of a first wafer level substrate; a second compound lens with a third lens element and a fourth lens element molded on both sides of a second wafer level substrate; a field stop disposed at an interface between the first lens element and the first wafer level substrate, or at an interface between the second lens element and the first wafer level substrate, or at an interface between the third lens element and the second wafer level substrate, or at an interface between the fourth lens element and the second wafer level substrate; and a spacer interposed between the first and second compound lenses to separate the first and second compound lenses with a predetermined gap, wherein the field stop is a coating layer with a polygonal transparent area corresponding to an effective sensing area.

Embodiments of the invention further provide a wafer level packaged image capture device, comprising: an aperture; a first compound lens with a first lens element and a second lens element molded on both sides of a first wafer level substrate; a second compound lens with a third lens element and a fourth lens element molded on both sides of a second wafer level substrate; a field stop disposed at an interface between the first lens element and the first wafer level substrate, or at an interface between the second lens element and the first wafer level substrate, or at an interface between the third lens element and the second wafer level substrate, or at an interface between the fourth lens element and the second wafer level substrate; and a spacer interposed between the first and second compound lenses to separate the first and second compound lenses with a predetermined gap; and a cover glass for an image sensor positioned behind the second compound lens, wherein the aperture, the first compound lens, the second compound lens and the cover glass are arranged in sequence from an object side to an image side, and the field stop is a coating layer with a polygonal transparent area corresponding to an effective sensing area.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments of the invention provide high performance wafer-level packages with image capture lens modules and CMOS sensors preventing ghost images and stray-light. An image capture device of an embodiment of the invention is made up of an image capture lens module associated with an image sensor. This association enables selecting a particular zone in space, eliminating the rest and optimizing the flux collecting capability of the image sensor. The image capture lens module controls incident rays by stops. For instance, an aperture stop confines the cross sectional area of the bundle of rays from object to image point, thereby controlling the brightness of the image. A field stop limits the angular field of view of the electro-optical device. Computation procedures vary from one application to another, depending upon its configuration and targeted functions. Multiple reflected lights inside the image capture lens module are intercepted by fixed field stops on wafer level packaged lens elements to improve quality of the image capture lens modules, and fabrication yield, and lower production costs. Optional designs of field stops on the interface between the lens elements are also provided, which limit the quantity of light arriving at the image sensor and enhances image quality, thereby preventing ghost images or lens flare.

Figure 1:
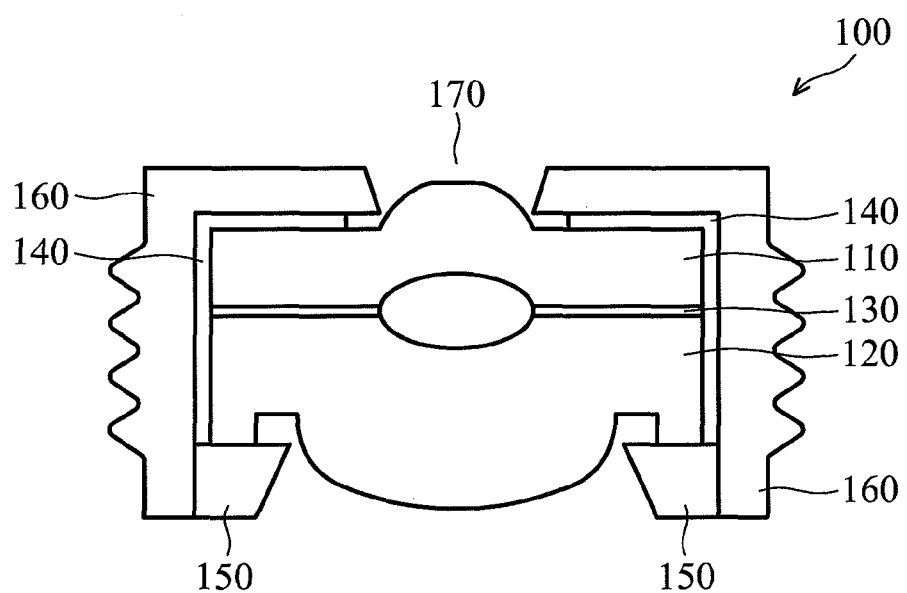
FIG. 1 is a schematic view illustrating a configuration of a conventional imaging lens.
Figure 2:
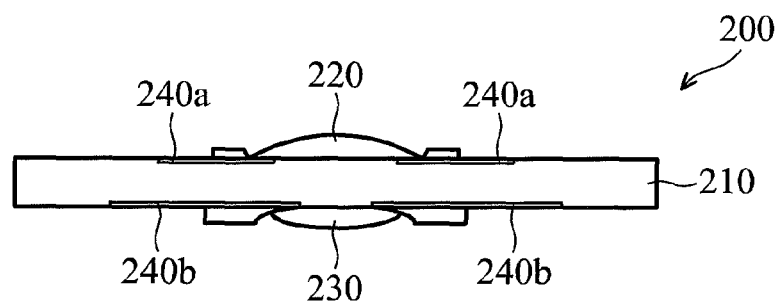
FIG. 2 is a schematic view illustrating an embodiment of an image capture compound lens of the invention.

FIG. 2 is a schematic view illustrating an embodiment of an image capture lens module of the invention. Referring to FIG. 2, an image capture lens module 200 includes a compound lens with a first lens element 220 and a second lens element 230 molded on both sides of a wafer level substrate 210. The wafer level substrate 210 comprises a glass substrate, a quartz substrate, or other optical ceramic substrates. In one embodiment, the first lens element 220 and the second lens element 230 comprise reflowable and UV or heat curable polymer compounds. The first lens element and the second lens element include aspheric surfaces. In other embodiments, the first lens element and the second lens element comprise optical grade plastics by molding. Field stops 240a and 240b are disposed at an interface between the first lens element and the wafer level substrate (240a) or at an interface between the second lens element and the wafer level substrate (240b), wherein the field stop is a coating layer with a polygonal transparent area corresponding to an effective sensing area of the image sensor. The field stops control incident rays and define the field of view. The field stops are designed to ensure that the field of view succeeds in reaching the sensing area of the image sensor. Namely, the field stops block rays from reaching out of an effective sensing area, so that the field of view is limited to be within the sensing area of the image sensor.

Figure 4A:
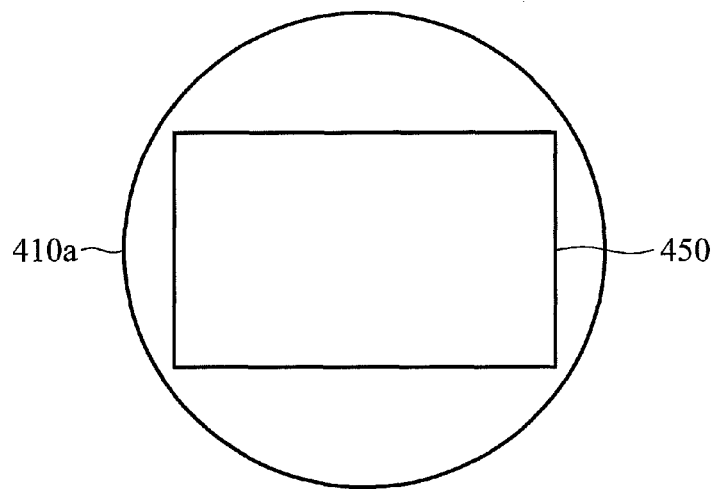
FIGS. 4A-4D schematically illustrate various embodiments of the polygonal transparent area of the field stops of the invention.
Figure 4B:
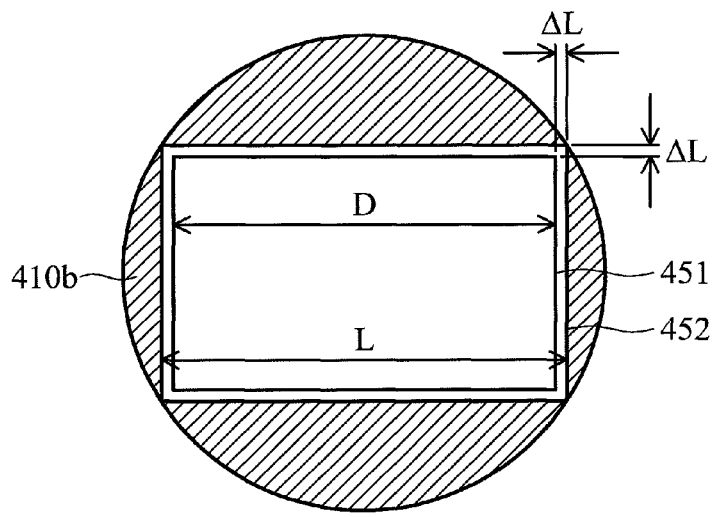
Figure 4C:
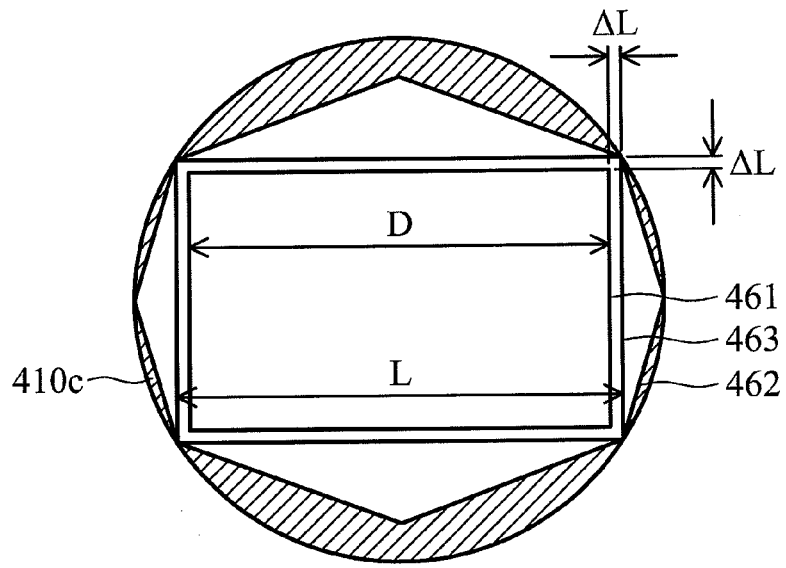
Figure 4D:
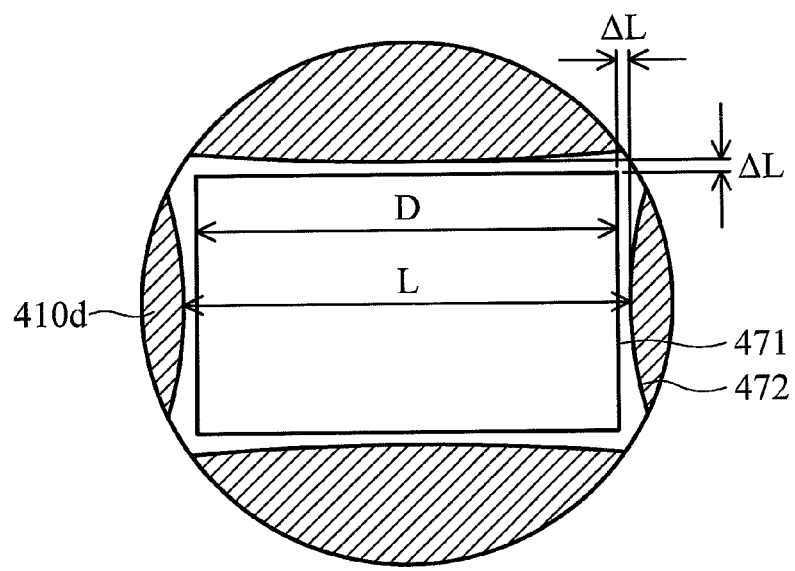

The area of the circular field stop 410a of FIG. 4A is greater than the effective sensing area 450, therefore resulting in undesirable ghost images and stray-light, as shown in FIG. 4A. In some embodiment, the polygonal transparent area of the field stop is a rectangular aperture, an octagonal aperture, or a pincushion aperture in shape and the actual polygonal transparent area of the field stop is greater than the effective sensing area, as shown in FIGS. 4B-4D. The rectangular 410b, polygonal (octagonal) 410c and pincushion 410d field stop apertures can not only increase the quantity of light arriving at the corners of the sensor areas, but also obstruct multiple reflected lights at the peripheral of the effective sensor region. Referring to FIG. 4B, the actual rectangular transparent area 452 of the field stop 410b has a length L, effective sensing area 451 of an image sensor has a length D, L is larger then D, and the difference between L and D is ΔL, wherein ΔL<0.1×D. Referring to FIG. 4C, the actual octagonal transparent area 462 of the field stop 410c has a fitted rectangle 463 having a length L, the effective sensing area 461 of an image sensor has a length D, L is larger than D, and the difference between L and D is ΔL, wherein ΔL<0.1×D. Referring to FIG. 4D, the pincushion transparent area 472 of the field stop 410d has a length L, the effective sensing area 471 of an image sensor has a length D, L is greater than D and the difference between L and D is ΔL, wherein ΔL<0.1×D.

The dimensions and aspect ratios can be adjusted in accordance with the effective sensing regions. In another embodiment, the rectangular and polygonal field stop apertures can be formed by a coating, lithography and etching process on the any wafer level substrate. The field stop apertures can be also directly coated on single surface or both surfaces of the lens elements. The field stop apertures can control the quantity of light entering the CMOS image sensor, thereby preventing ghost images and stray light.

Figure 3:
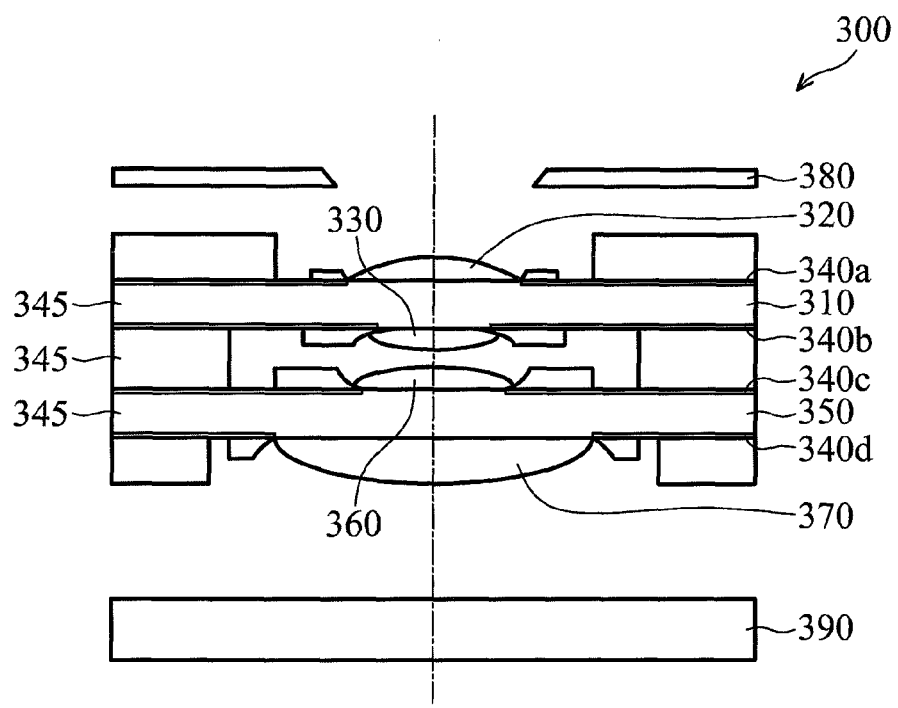
FIG. 3 is a schematic view illustrating another embodiment of a wafer level packaged image capture device of the invention.

FIG. 3 is a schematic view illustrating another embodiment of a wafer level packaged image capture device of the invention. Referring to FIG. 3, a wafer level packaged image capture device 300 comprises an aperture stop 380, a first compound lens with a first lens element 320 and a second lens element 330 molded on both sides of a first wafer level substrate 310, a second compound lens with a third lens element 360 and a fourth lens element 370 molded on both sides of a second wafer level substrate 350. Several field stops 340a-340d are disposed at an interface between the first lens element and the first wafer level substrate, or at an interface between the second lens element and the first wafer level substrate, or at an interface between the third lens element and the second wafer level substrate, or at an interface between the fourth lens element and the second wafer level substrate. Some spacers 345 are interposed between the first and second compound lenses to separate the first and second compound lenses with a predetermined gap. A cover glass 390 for an image sensor is positioned behind the second compound lens, wherein the aperture 380, the first compound lens 310-330, the second compound lens 350-370 and the cover glass 390 are arranged in sequence from an object side to an image side, and the field stops 340a-340d are a coating layer with a polygonal transparent area corresponding to an effective sensing area of the image sensor. The field stops 340a-340d are disposed between the aperture stop 380 and the cover glass 390. The polygonal transparent area of the field stop is a rectangular aperture, an octagonal aperture, or a pincushion aperture in shape, as shown in FIGS. 4B-4D. The aperture stop 380 can adjust the quantity of light entering from the outside. The field stops 340a-340d can control the quantity of light entering the CMOS image sensor, thereby preventing ghost images and stray light.

When comparing the circular field stop of FIG. 4A with the polygonal transparent areas of the field stops of FIGS. 4B-4D, it is shown that opaque areas 410b-410d of the field stops can obstruct more quantity of light into the sensor area. More specifically, a rectangular field stop aperture can filter more quantity of the stray light onto the sensor. Simulated results showed that the quantity of light arriving at the CMOS image sensor with the rectangular field stop is less than the quantity of light arriving at the CMOS image sensor with the circular field stop.

While the invention has been described by way of example and in terms of exemplary embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image capture lens module, comprising:
   an aperture stop;
   a cover glass;
   a compound lens with a first lens element and a second lens element molded on both sides of a substrate disposed between the aperture stop and the cover glass;
   a field stop disposed at an interface between the first lens element and the substrate or at an interface between the second lens element and the substrate, wherein the field stop is a coating layer with a polygonal transparent area; and
   an image sensing device, wherein the polygonal transparent area of the field stop is greater than the effective sensing area of the image sensing device.

2. The image capture lens module according to claim 1, wherein the substrate comprises a glass substrate, a quartz substrate, or other optical ceramic substrates.

3. The image capture lens module according to claim 1, wherein the first lens element and the second lens element include aspheric surfaces.

4. The image capture lens module according to claim 1, wherein the first lens element and the second lens element comprise reflowable and UV curable polymer compounds.

5. The image capture lens module according to claim 1, wherein the first lens element and the second lens element comprise an optical grade plastic by molding.

6. The image capture lens module according to claim 1, wherein the polygonal transparent area of the field stop is rectangular, octagonal or distorted pincushion.

7. The image capture lens module according to claim 1, wherein the polygonal transparent area of the field stop is rectangular, and the rectangular transparent area of the field stop has a length L, the effective sensing area of the image sensing device has a length D, L is larger then D.

8. The image capture lens module according to claim 7, wherein a difference between L and D is ΔL, wherein ΔL<0.1×D.

9. An image lens module, comprising:
   a first compound lens with a first lens element and a second lens element molded on both sides of a first substrate;
   a second compound lens with a third lens element and a fourth lens element molded on both sides of a second substrate;
   a field stop disposed at an interface between the first lens element and the first substrate, or at an interface between the second lens element and the first substrate, or at an interface between the third lens element and the second substrate, or at an interface between the fourth lens element and the second substrate;
   a spacer interposed between the first and second compound lenses to separate the first and second compound lenses with a predetermined gap, wherein the field stop is a coating layer with a polygonal transparent area; and
   an image sensing device, wherein the polygonal transparent area of the field stop is greater than the effective sensing area of the image sensing device.

10. The image capture lens module according to claim 9, wherein the first and second substrates comprise a glass substrate, a quartz substrate, and optical ceramic substrates.

11. The image capture lens module according to claim 9, wherein the first, the second, the third, and the fourth lens elements include aspheric surfaces.

12. The image capture lens module according to claim 9, wherein the first, the second, the third, and the fourth lens elements comprise reflowable and UV curable polymer compounds.

13. The image capture lens module according to claim 9, wherein the first, the second, the third, and the fourth lens elements comprise an optical grade plastic by molding.

14. The image capture lens module according to claim 9, wherein the polygonal transparent area of the field stop is rectangular, octagonal or distorted pincushion.

15. A packaged image capture device, comprising:
    an aperture;
    a first compound lens with a first lens element and a second lens element molded on both sides of a first substrate;
    a second compound lens with a third lens element and a fourth lens element molded on both sides of a second substrate;
    a field stop disposed at an interface between the first lens element and the first substrate, or at an interface between the second lens element and the first substrate, or at an interface between the third lens element and the second substrate, or at an interface between the fourth lens element and the second substrate;
    a spacer interposed between the first and second compound lenses to separate the first and second compound lenses with a predetermined gap;
    a cover glass positioned behind the second compound lens, wherein the aperture, the first compound lens, the second compound lens and the cover glass are arranged in sequence from an object side to an image side, wherein the field stop is a coating layer with a polygonal transparent area; and
    an image sensing device, wherein the polygonal transparent area of the field stop is greater than the effective sensing area of the image sensing device.

16. The packaged image capture device according to claim 15, wherein the first and second substrates comprise a glass substrate, a quartz substrate, and optical ceramic substrates.

17. The packaged image capture device according to claim 15, wherein the first, the second, the third, and the fourth lens elements include aspheric surfaces.

18. The packaged image capture device according to claim 15, wherein the first, the second, the third, and the fourth lens elements comprise reflowable and UV curable polymer compounds.

19. The packaged image capture device according to claim 15, wherein the first, the second, the third, and the fourth lens elements comprise an optical grade plastic by molding.

20. The packaged image capture device according to claim 15, wherein the polygonal transparent area of the field stop is rectangular, octagonal or distorted pincushion.

* * * * *